(12) United States Patent
Wu et al.

(10) Patent No.: US 10,741,941 B2
(45) Date of Patent: Aug. 11, 2020

(54) PLUG CONNECTOR ASSEMBLY HAVING AN INSULATIVE MEMBER

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Kun-Lin Wu, New Taipei (TW); Chien-Chiung Wang, New Taipei (TW); Xue-Liang Zhang, Kunshan (CN); Fu-Jun Sun, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 84 days.

(21) Appl. No.: 16/184,941

(22) Filed: Nov. 8, 2018

(65) Prior Publication Data

US 2019/0140374 A1 May 9, 2019

(30) Foreign Application Priority Data

Nov. 8, 2017 (CN) .......................... 2017 1 1089482
Nov. 8, 2017 (CN) .......................... 2017 2 1476264

(51) Int. Cl.
*H01R 12/53* (2011.01)
*H01R 43/02* (2006.01)
(Continued)

(52) U.S. Cl.
CPC ............. *H01R 12/53* (2013.01); *H01R 4/027* (2013.01); *H01R 43/0256* (2013.01); *H01R 43/0263* (2013.01); *H05K 1/117* (2013.01); *H01R 13/6581* (2013.01); *H01R 13/6592* (2013.01); *H05K 2201/09409* (2013.01); *H05K 2201/09445* (2013.01)

(58) Field of Classification Search
CPC ...................................................... H01R 12/53
See application file for complete search history.

(56) References Cited

U.S. PATENT DOCUMENTS

| 8,840,432 B2 * | 9/2014 | Alden, III | ......... H01R 13/6585 439/607.46 |
| 9,774,113 B2 | 9/2017 | Zhang et al. | |

(Continued)

*Primary Examiner* — James Harvey
(74) *Attorney, Agent, or Firm* — Wei Te Chung; Mind Chieh Chang

(57) ABSTRACT

A plug connector assembly includes: a plug connector having a cage, and a PCB received in the cage, the PCB including a mating end for being mated with a mating connector and an opposite connecting end, the connecting end comprising a first row of pads and a second row of pads disposed at one side of the PCB; at least one cable electrically connected to the connecting end, the at least one cable comprising a number of core wires, the core wires comprising a first group of core wires and a second group of core wires, the first group of core wires extending beyond the first group of core wires, the first group of core wires soldered to the first row of pads, the second group of core wires soldered to the second row of pads; and an insulative member isolating a soldering area of the first and second group of core wires.

18 Claims, 12 Drawing Sheets

(51) Int. Cl.
*H05K 1/11* (2006.01)
*H01R 4/02* (2006.01)
*H01R 13/6581* (2011.01)
*H01R 13/6592* (2011.01)

(56) References Cited

U.S. PATENT DOCUMENTS

| | | | | |
|---|---|---|---|---|
| 2011/0306244 | A1* | 12/2011 | Zhang | H01R 9/034 |
| | | | | 439/624 |
| 2013/0252471 | A1* | 9/2013 | Wu | H01R 12/53 |
| | | | | 439/630 |
| 2014/0220822 | A1* | 8/2014 | Keyser | H01R 13/6592 |
| | | | | 439/607.46 |
| 2017/0040746 | A1* | 2/2017 | Zhang | H01R 12/594 |
| 2017/0294739 | A1* | 10/2017 | Pao | H01R 12/53 |
| 2018/0097300 | A1* | 4/2018 | Tanaka | H01R 9/03 |
| 2018/0115093 | A1* | 4/2018 | Gross | H01R 13/5845 |
| 2018/0248279 | A1* | 8/2018 | Kumakura | H01R 9/035 |
| 2018/0287280 | A1 | 10/2018 | Ratkovic et al. | |
| 2019/0140374 | A1* | 5/2019 | Wu | H01R 12/53 |
| 2020/0036117 | A1* | 1/2020 | Little | H01R 12/596 |

\* cited by examiner

US 10,741,941 B2

PLUG CONNECTOR ASSEMBLY HAVING AN INSULATIVE MEMBER

BACKGROUND OF THE INVENTION

1. Field of the Invention

The present invention relates, generally, to a plug connector assembly, and more particularly, to a high density plug connector assembly for transmitting high speed signals.

2. Description of Related Arts

U.S. Pat. No. 8,840,432 issued on Sep. 23, 2014, discloses a plug connector assembly comprising a PCB, a plurality of core wires electrically connecting to the PCB, and a cage electrically connecting to the PCB and being disposed outside the core wires. Each of the core wires has a center conductor, an insulative layer disposed outside the center conductor, and a shield layer disposed outside the insulative layer. The cage is mounted on the PCB and electrically connects to the ground layer of the PCB in a way that a mounting feet of the cage mates with a hole of the PCB. However, it is difficult to ensure that each cage is electrically connected to the shield layer of the respective core wires, and a short circuit with the center conductor may happen.

Therefore, there is a need to improve the plug connector assembly.

SUMMARY OF THE INVENTION

An object of the present invention is to provide a plug connector assembly with a high reliability when at least one cable thereof is electrically connected to a printed circuit board thereof.

To achieve the above-mentioned object, a plug connector assembly comprises: a plug connector having a cage, and a printed circuit board (PCB) received in the cage, the PCB comprising a mating end for being mated with a mating connector and an opposite connecting end, the connecting end comprising a first row of pads and a second row of pads disposed at one side of the PCB; at least one cable electrically connected to the connecting end, the at least one cable comprising a number of core wires, the core wires comprising a first group of core wires and a second group of core wires extending beyond the first group of core wires, the first group of core wires soldered to the first row of pads, the second group of core wires soldered to the second row of pads; and an insulative member isolating a soldering area of the first group of core wires and the second group of core wires.

According to the present invention, the plug connector assembly further includes the first insulative member which isolates the soldering area where the first group of core wires and the second group of core wires are soldered in order to prevent accidental short circuit when the high density plug connector assembly is soldered to the printed circuit board.

DETAILED DESCRIPTION OF THE PREFERRED EMBODIMENT

Figure 1:
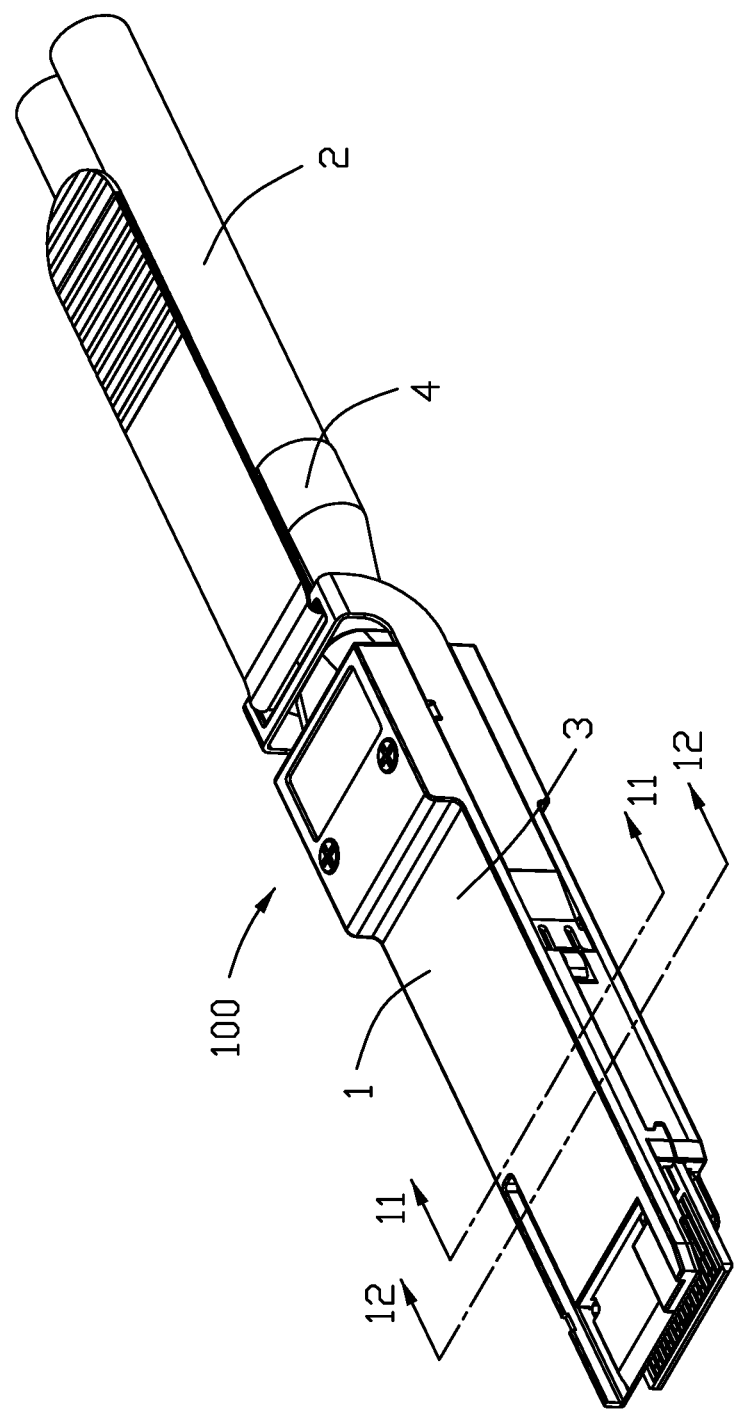
FIG. 1 is a perspective view of a first embodiment of a plug connector assembly in accordance with present invention.
Figure 2:
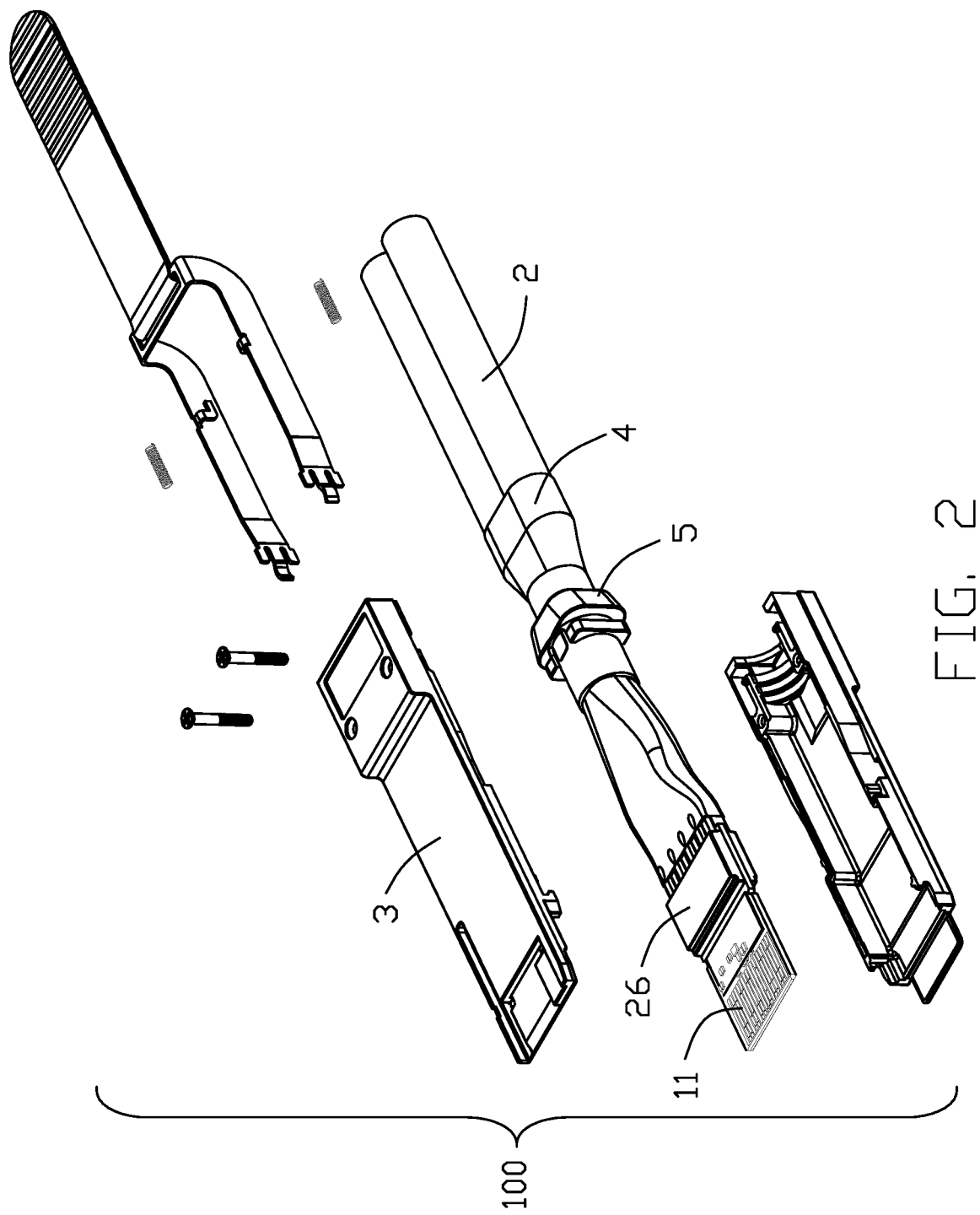
FIG. 2 is an exploded view of the plug connector assembly as shown in FIG. 1.
Figure 3:
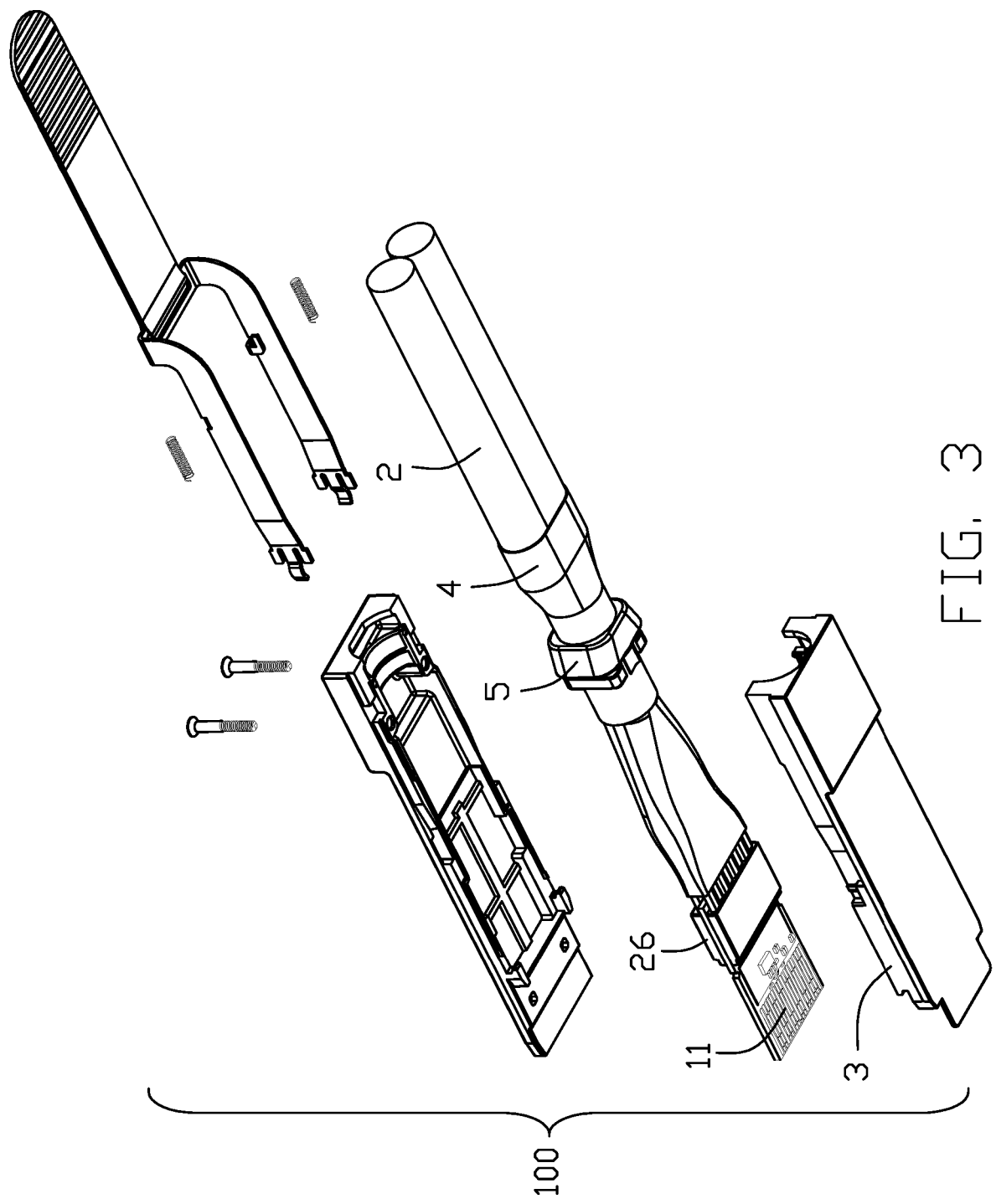
FIG. 3 is an exploded view similar to FIG. 2, but from a different perspective.
Figure 4:
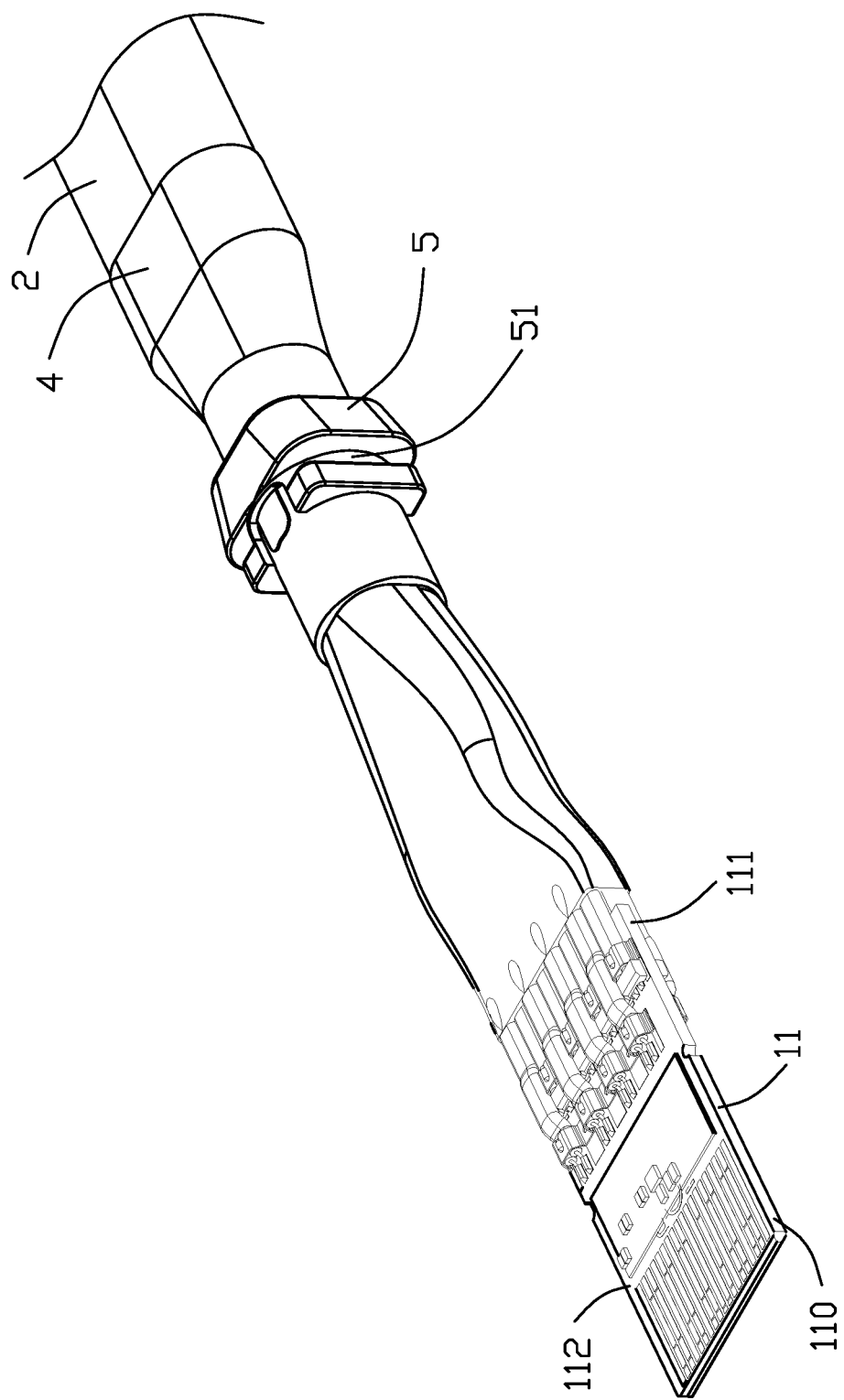
FIG. 4 is a perspective view of the plug connector assembly of FIG. 1 with the cage removed.
Figure 5:
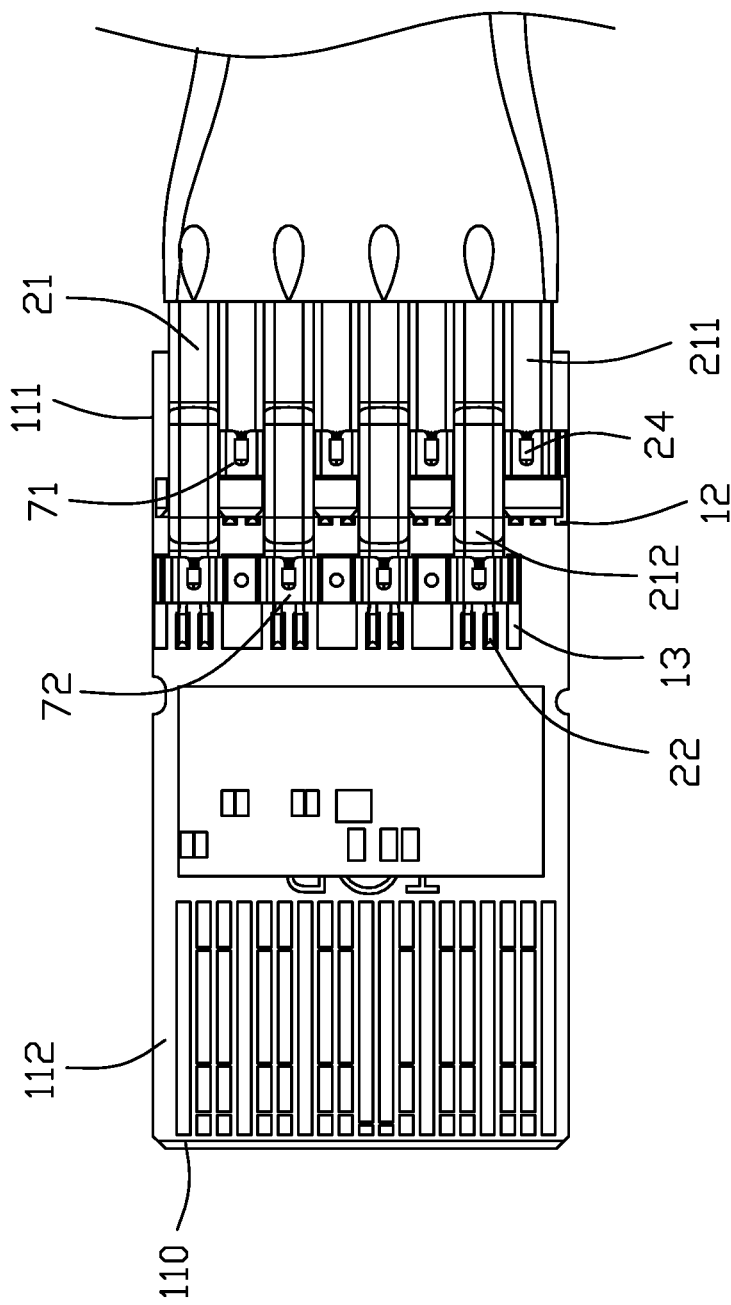
FIG. 5 is a top view of the plug connector assembly with the cage removed of FIG. 4.
Figure 6:
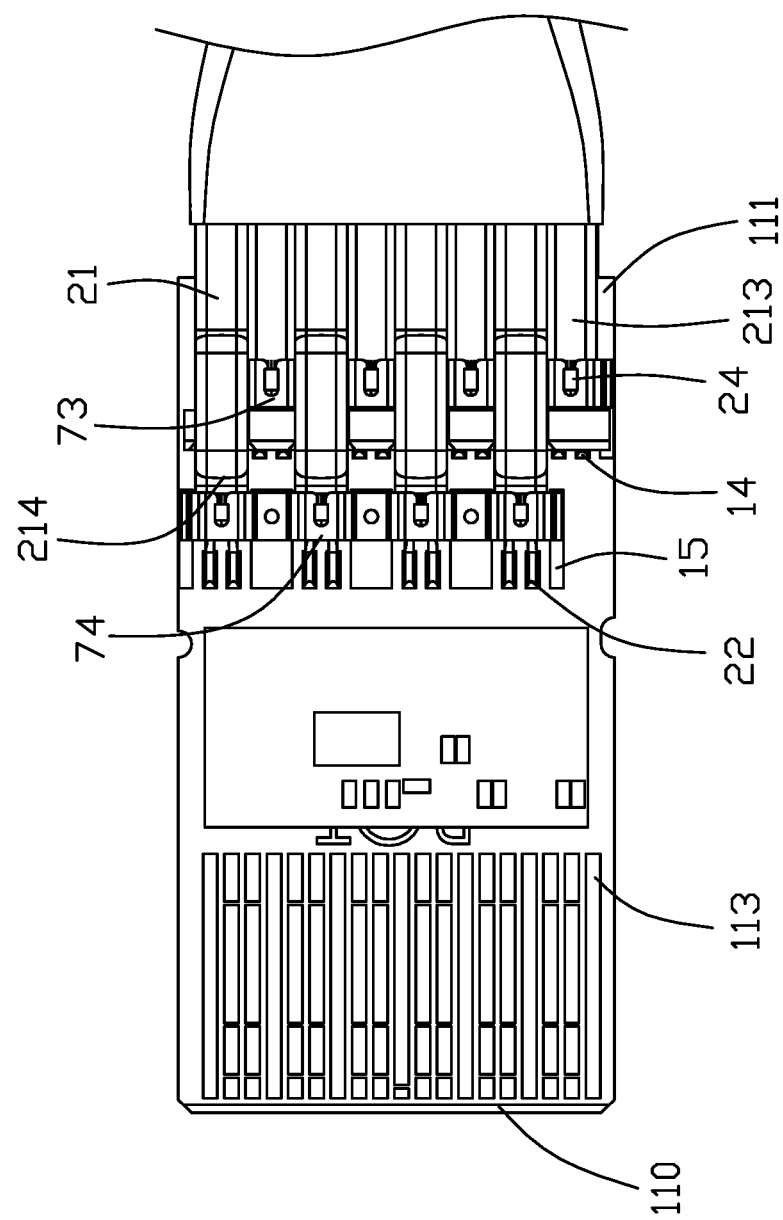
FIG. 6 is a bottom view of the plug connector assembly with the cage removed of FIG. 4.
Figure 7:
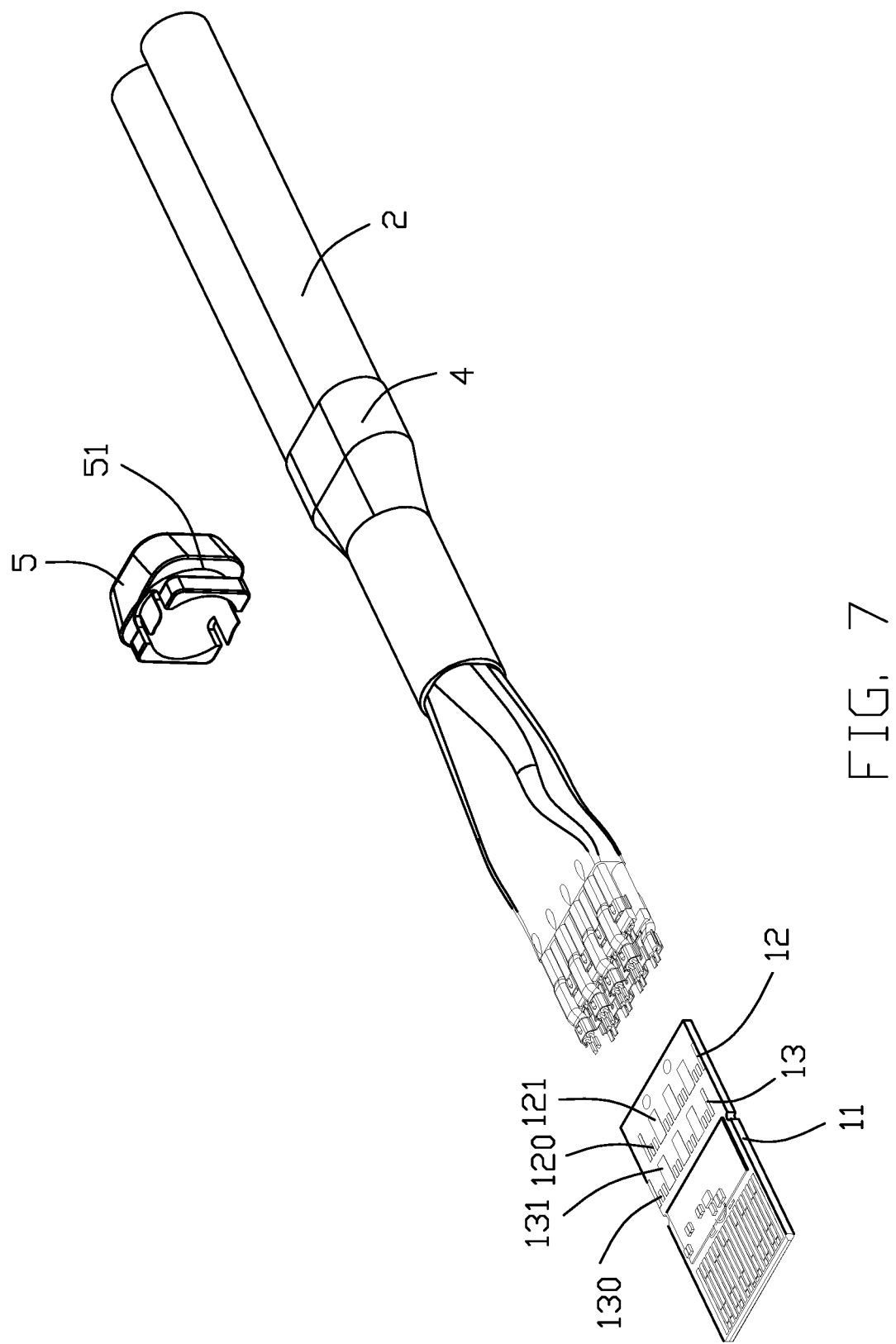
FIG. 7 is a further exploded view of the plug connector assembly with the cage removed of FIG. 4.
Figure 8:
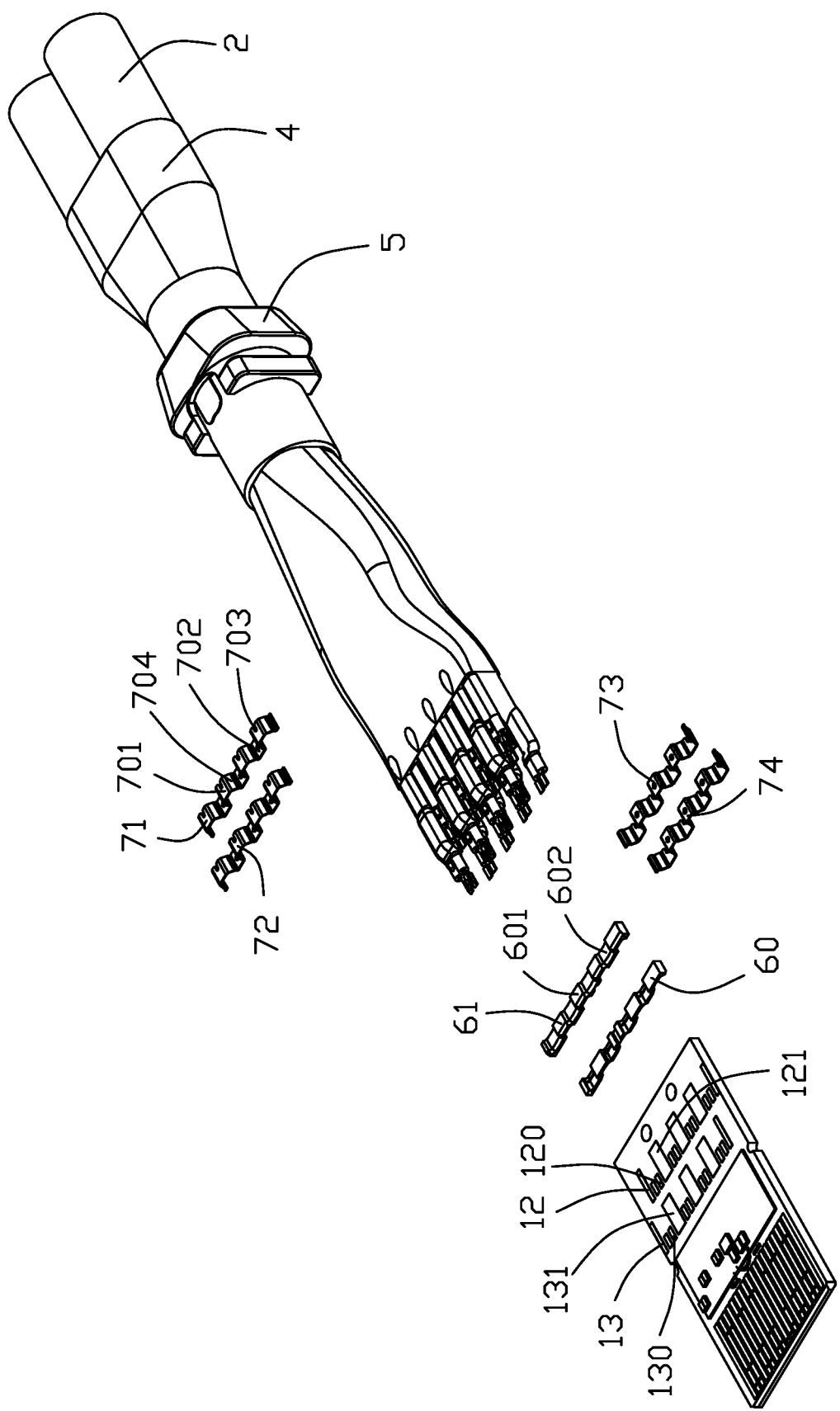
FIG. 8 is a further exploded view of the plug connector assembly with the cage removed similar to FIG. 7 but from a different perspective.
Figure 9:
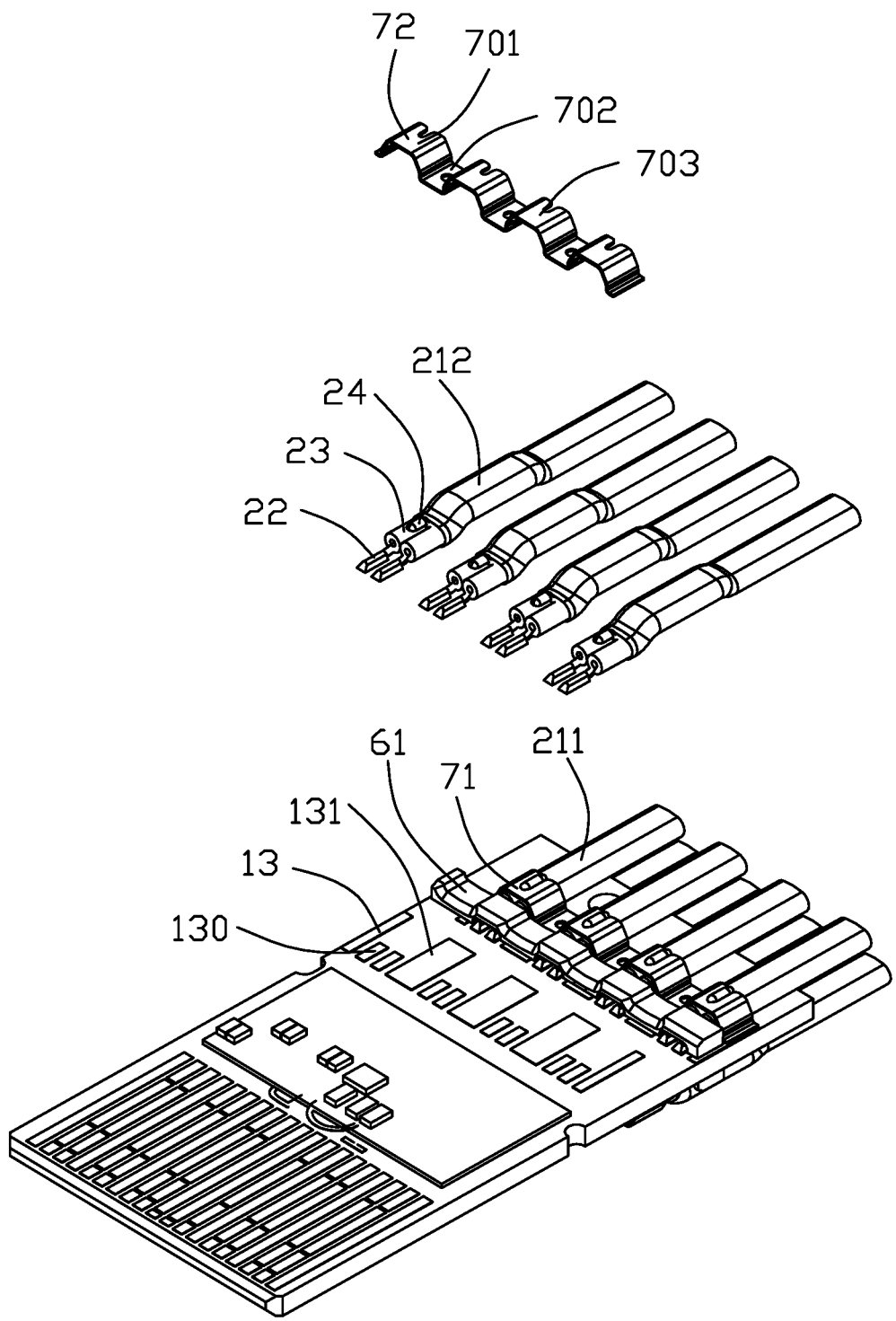
FIG. 9 is a further exploded view of the plug connector assembly with the cage removed of FIG. 5.
Figure 10:
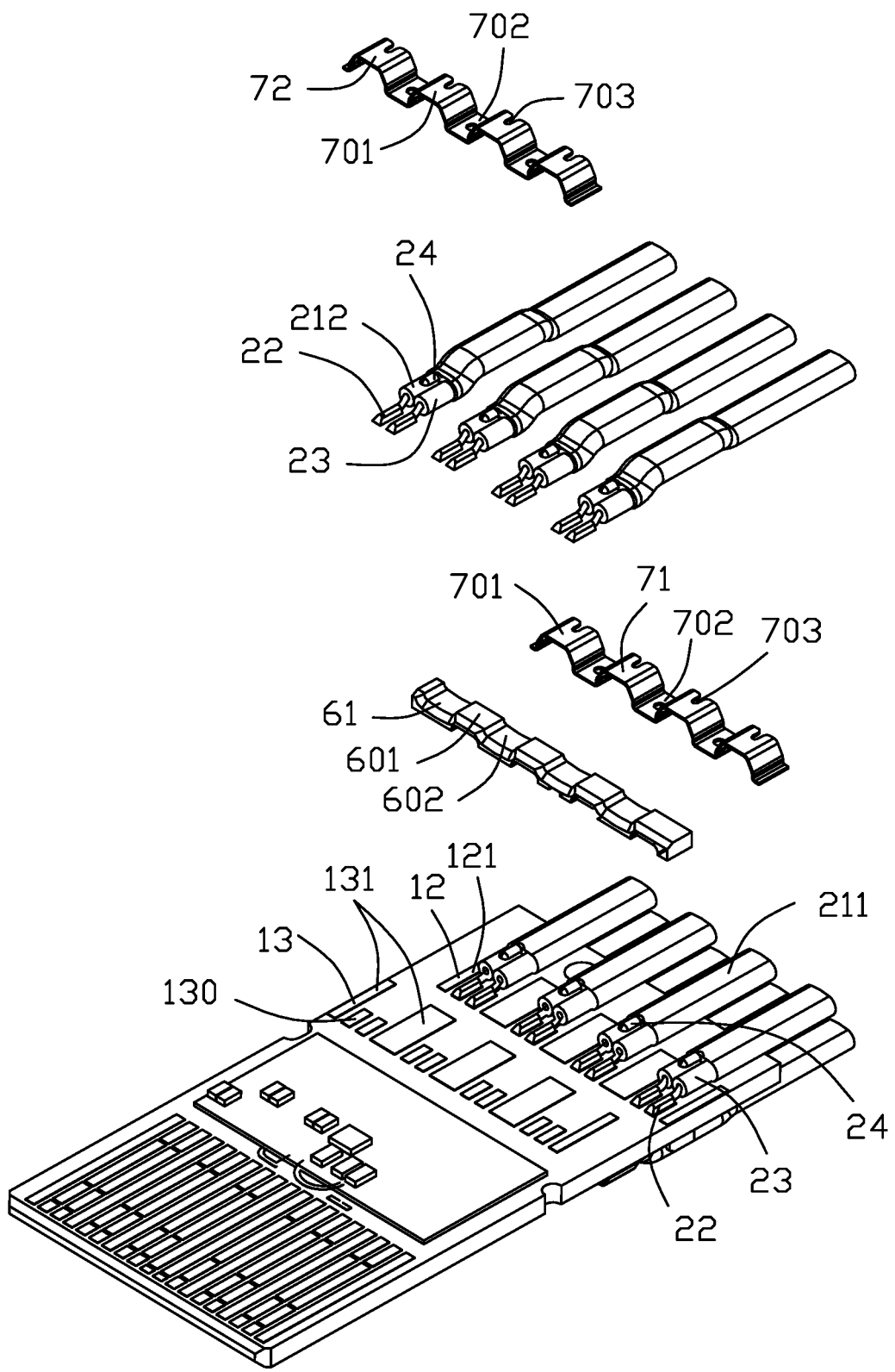
FIG. 10 is a further exploded view of the plug connector assembly with the cage removed of FIG. 9.

Reference will now be made in detail to a preferred embodiment of the present invention. Referring to FIGS. 1 to 11, a first embodiment of a plug connector assembly 100 includes a plug connector 1, a cable 2 connected to the plug connector 1, a sleeve 4 disposed on the cable 2, and a fixing member 5 disposed on the sleeve 4. The plug connector 1 includes a conductive cage 3, and a printed circuit board 11 received in the cage 3. The plug connector assembly 100 of this embodiment conforms to the specification of QSFP-DD that defines eight transmit channels and eight receive channels, and the signal transmission rate of each channel is up to 28 Gbps or more. Of course, the present invention also can be applied to the high speed plug connector assembly which conforms to the developing specification such as SFP-DD or other undeveloped specification that has the same number of channels or not, or that can transfer the signal with a higher speed.

The printed circuit board 11 includes a mating end 110 that can be mated with a mating connector, and a connecting end 111 opposite to the mating end 110 that can be electrically connected to the cable 2. The printed circuit board 11 includes a first face 112, and a second face 113 opposite to the first face 112. The connecting end 111 of the printed circuit board 11 defines a first row of pads 12 on the first face 112, and a second row of pads 13 disposed in front of the first row of pads 12. The connecting end 111 of the printed circuit board 11 defines a third row of pads 14 on the second face 113, and a fourth row of pads 15 disposed in front of the third row of pads 14. The first row of pads 12 includes a plurality of pairs of first signal pads 120, and a first ground pad 121 disposed between the pairs of the first signal pads 120. A width of the first ground pad 121 is equal to or greater than a width of the first signal pad 120. Specifically, in the present embodiment, the width of each of the first ground pads 121 positioned at the two out sides is equal to or greater than the width of the first signal pad 120. The second row of pads 13 includes a plurality of second signal pads 130, and a second ground pad 131 disposed between the pairs of the second signal pads 130. The way that the second row of pads 13 disposes is similar to that of the first row of pads 12, however, the second ground pad 131 and the second signal pad 130 are offset from the corresponding first ground pad 121 and the second signal pad 131 in a transverse direction. The arrangement of the third row of pads 14 and the fourth row of pads 15 is similar to that of the first row of pads 12 and the second row of pads 13, and will not be described herein.

The cable 2 includes a pair, and the pair of cables 2 is gathered into a strand at one end to connect with the printed circuit board. The cable 2 includes a plurality of core wires 21, and the core wires 21 are divided into a group of core wires 211, a second group of core wires 212 extending beyond the first group of core wires 211, a third group of core wires 213 being flush with the first group of core wires 211, and a fourth group of core wires 214 extending beyond the third group of core wires 213 and being flush with the second group of core wires 212. Each of the core wires 21 includes a pair of center conductors 22, a pair of insulative (inner) layers 23 covering the pair of center conductors 22, and a ground/drain wire 24, and each ground wire 24 of the core wires 21 is processed to be shorter than the corresponding center conductor 22. An insulative (outer) layer 25 is further applied upon the insulative layers 23 and the ground wire 24. The first group of core wires 211 is soldered to the first row of pads 12, and the second group of core wires 212 is soldered to the second row of pads 13, and the third group of core wires 213 is soldered to the third row of pads 14, and the fourth group of core wires 214 is soldered to the fourth row of pads 15.

The plug connector assembly 100 further includes a first insulative member 61 isolating a soldering area where the first group of core wires 211 are soldered, and a second insulative member 62 isolating a soldering area where the third group of core wires 213 are soldered. In details, the first/second insulative member 61/62 protectively covers the first/third row of pads 12/14 where the first/third group of core wires 211/213 are soldered. The shapes and structures of the first insulative member 61 and the second insulative member 62 are the same, which have elongating shapes, and each of them includes a covering portion 601, and a depression/recession portion 602 that is alternated with the covering portion 601. The covering portion 601 of the first insulative member 61 covers the soldering area where the first group of core wire 211 and the first row of pads 12 are soldered, and the depression portion 602 of the first insulative member 61 lets the second group of core wires 212 to pass and to extend to the front for being soldered to the second row of pads 13. As the same, the covering portion 601 of the second insulative member 62 covers the soldering area where the third group of core wires 213 and the third row of pads 14 are soldered, and the depression portion 602 of the second insulative member 62 lets the fourth group of core wires 214 to pass and to extend to the front for being soldered to the fourth row of pads 15.

The plug connector assembly 100 further includes a first conductor member 71, a second conductor member 72, a third conductor member 73, and a fourth conductor member 74. The first conductor member 71 is disposed on the receptive first group of core wires 71 and is electrically connected to the first ground pad 121, and each of the ground wire 24 of the first group of core wires 211 is electrically connected to the first conductor member 71. The second conductor member 72 is disposed on the receptive second group of core wires 212 and is electrically connected to the second ground pad 131, and each of the ground wire 24 of the second group of core wires 212 is electrically connected to the second conductor member 72. The connection of the third conductor member 73 and the third group of core wires 213 is similar to the connection of the first conductor member 71 and the first group of core wires 211, and the connection of the fourth conductor member 74 and the fourth group of core wires 214 is similar to the connection of the second conductor member 72 and the second group of core wires 212. Each of the first conductor member 71, the second conductor member 72, the third conductor member 73, and the fourth conductor member is formed as an integral structure, that includes an extrusion portion 701, and a depression portion 702 alternately arranged with the extrusion portion 701, and the extrusion portion 701 of the first conductor member 71 covers the first group of core wires 21, and the depression portion 702 is soldered to the respective first ground pad 121, and the second group of core wires 122 passes through the depression portion 702 of the first conductor member 71 and then extends to the front for being soldered to the respective second signal pad 130, and the extrusion portion 701 of the second conductor member 72 covers the respective second group of core wires 21, and the depression portion 702 is soldered to the respective second ground pad 131, and the configuration of the third conductor member 73 and the fourth conductor member 74 is similar to the configuration of the first conductor member 71 and the second conductor member 72. Each of the first conductor member 71, the second conductor member 72, the third conductor member 73, and the fourth conductor member 74 has a plurality of gaps 703 disposed thereon for receiving the respective ground wire 24.

The fixing member 5 is sleeved at the portion where the pair of cables 2 are gathered into a single strand, and is fixed to the cable 2 by gluing or other means, and the fixing member 5 includes a groove 51 latched to the cage 3 that fixes the cable 2 to the cage 3.

The plug connector assembly further includes a conductive fabric warping at the portion where the two cables are gathered into the single strand, that can form a tight electrical seal between the conductive fabric and the cage 3.

A method of assembling a plug connector assembly comprises the steps of: providing the printed circuit board 11; providing the pair of independent cables 2, that the cables are gathered into a single strand after exposing the core wires 21 at the same end, that the fixing member 5 is fixed to the portion where the two cables 2 are gathered into a single strand by gluing or other means, that the core wires 21 are processed as a first group of core wires 211, a second group of core wires 212 extending forward and beyond the first group of core wires 211, a third group of core wires 213 being flush with the first group of core wires 211, and a fourth group of core wires 214 being flush with the second group of core wires 212, and that the first group of core wires 211 is soldered to the respective first row of pads 12; and providing the first insulative member 61 that is disposed at the soldering area of the first group of core wires 211 and the first row of pads 12 after that the first group of core wires 211 is soldered to the respective first row of pads 12, that the second group of core wires 212 is soldered to the respective second row of pads 13 after crossing the first insulative member 61, that the third group of core wires 213 is soldered to the third row of pads 14, that the second insulative member 62 is disposed at the soldering area of the third group of core wires 213 and the third row of pads 14, that the fourth group of core wires 214 is soldered to the fourth row of pads 15 after crossing the second insulative member 62, that the third group of wires 213 is soldered at the same time of the first group of core wires 211, that the second group of core wires 212 is soldered at the same time of the fourth group of core wires 214.

The first conductor member 71, the second conductor member 72, the third conductor member 73, and the fourth conductor member 74 can be soldered at the respective portion before the core wires 21 are soldered to the printed circuit board 11. The center conductor 22 is soldered to the respective portion of the printed circuit board 11 after each of the core wires 21 crossing the first conductor member 71, the second conductor member 72, the third conductor member 73, and the fourth conductor member 74 from bottom, and the ground wire 24 is received in the respective gap 703 and is connected by soldering. The second group of core wires 212 crosses the first conductor member 71 from above and then crosses the second conductor member 72 from bottom, and then the center conductors 22 of the second group of core wires 212 are soldered to the second signal pads 130. The way the fourth group of core wires 214 is soldered is similar to that of the second group of core wires 212.

The printed circuit board 11 connected to the cables 2 is disposed in the conductive cage 3 after the core wires 21 are soldered to the printed circuit board, and the fixing member 5 is latched to the conductive cage 3. Understandably, alternately a conductive shielding layer (not shown) may be optionally located between the insulative layer 23 and the insulative layer 25 wherein the corresponding ground wire 24 is either located inside or outside such a conductive shielding layer. In this embodiment, a pair of insulative over-molding pieces 26 is further molded upon the conductor members 71-74, the front portions of the group of core wires 211-214, the insulative members 61-62, and the surfaces 112-113 of the printed circuit board 11 for protection.

Figure 11:
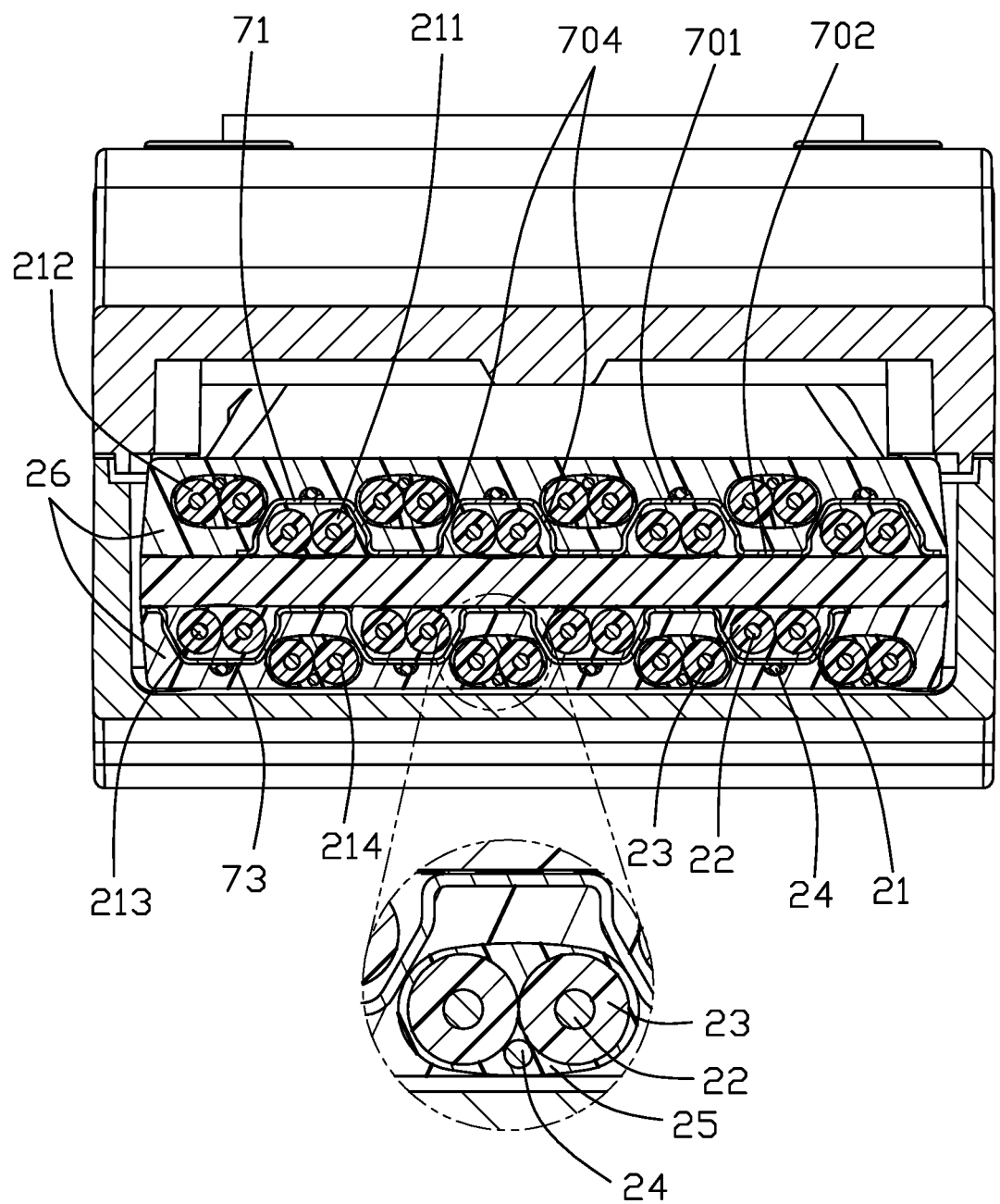
FIG. 11 is a cross-sectional view taken along line 11-11 in FIG. 1.
Figure 12:
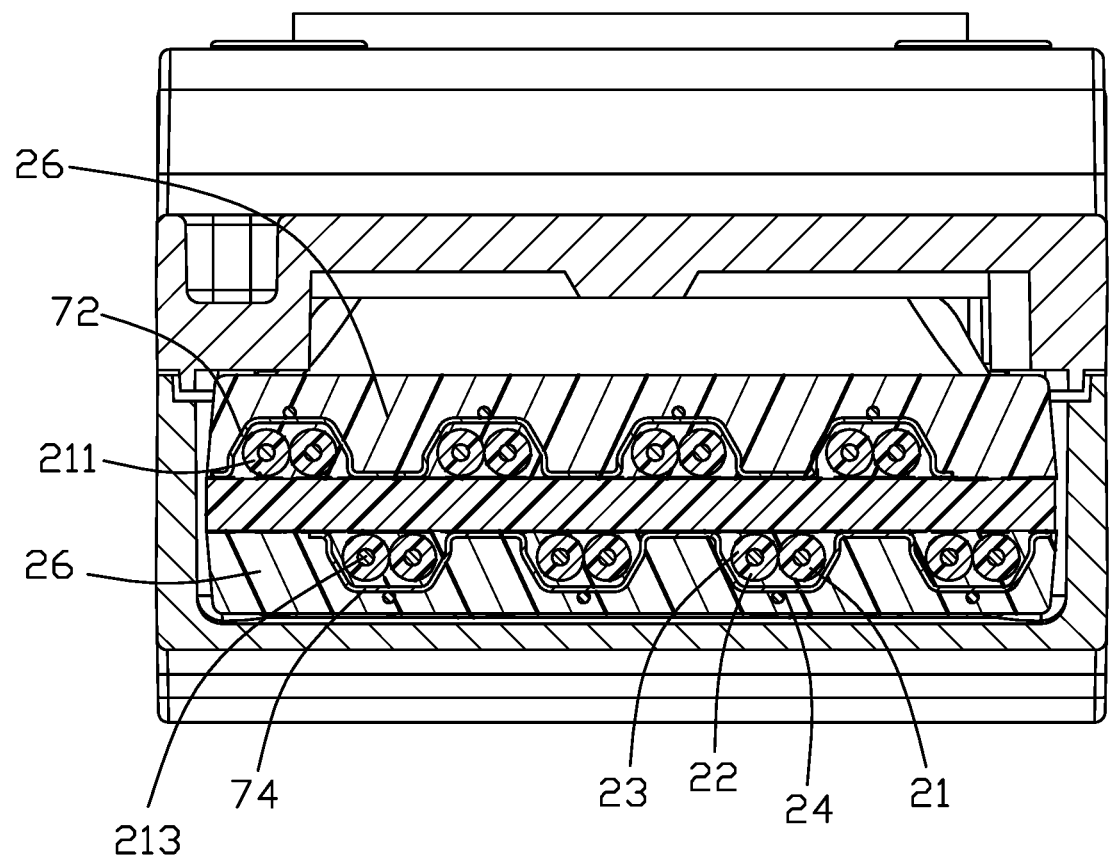
FIG. 12 is a cross-sectional view taken along line 12-12 in FIG. 1.

Notably, as shown in FIG. 11, each of the conductor member 71-74 has an oblique portion 704 between the extrusion portion 701 and the depression portion 702 so as to support the corresponding core wire 21 which extends through the corresponding depression portion 702. Generally speaking, the core wires 21 of the first/third group of core wires 211/213 are intimately directly located upon the surface 112/113 of the printed circuit board 11 while the core wires 21 of the second/fourth group of core wires 212/214 are spatially located from the surface 112/113 of the printed circuit board 11 with the depression portions 702 of the conductor members 71/73 therebetween, wherein the core wires of the second group 212 are significantly spaced from the surface 112/113 of the printed circuit board 11 by the oblique portion 704 with one half portion being essentially exposed outside of the corresponding depression portion 702 in the vertical direction. In other words, the core wire 21 of the first/third group of core wires 211/213 is essentially enclosed within a space defined between the extrusion portion 701 of the first/third conductor member 71/73 and the printed circuit board 11 while the core wire 21 of the second/fourth group of core wires 212/214 is exposed in the vertical direction to an exterior without being hidden by the conductor member 71/73 before the over-molding piece 26 is applied thereon. Understandably, the reason why the core wires 21 of the first group of core wires 211 require to be offset from the core wires 21 of the second group of core wires 212 in the vertical direction around the first conductor member 71 is to allow the signal pads 120 in the first row of pads 12 and the second row of pads 13 commonly keep the same pitch along the transverse direction perpendicular to both the vertical direction and the front-to-back direction, when viewed along the front-to-back direction. This feature may ease the layout design of the printed circuit board 11 and assure the electrical performance.

What is claimed is:

1. A plug connector assembly comprising:
a plug connector comprising:
a cage; and
a printed circuit board (PCB) received in the cage, the PCB comprising a mating end for being mated with a mating connector and an opposite connecting end, the connecting end comprising a first row of pads and a second row of pads disposed at one side of the PCB;
at least one cable electrically connected to the connecting end, the at least one cable comprising a number of core wires, the core wires comprising a first group of core wires and a second group of core wires extending beyond the first group of core wires, the first group of core wires soldered to the first row of pads, the second group of core wires soldered to the second row of pads; and
an insulative member covering and isolating a soldering area where the first group of core wires are soldered;
wherein the insulative member is elongate, the insulative member comprising a covering portion covering the soldering area of the first group of core wires and a depression portion through which the second group of core wires passes.

2. An electrical connector assembly comprising:
a cage;
a printed circuit board enclosing within the cage and defining opposite first and second surfaces in a vertical direction, a first row of conductive pads and a second row of conductive pads formed on the first surface, the second row of pads located in front of the first row of pads in a front-to-back direction perpendicular to the vertical direction;
a first group of core wires soldered to the corresponding first row of conductive pads, respectively;
a second group of core wires soldered to the corresponding second row of conductive pads, respectively; and
a first conductor member soldered upon the first row of pads and including a plurality of extrusion portions and a plurality of depression portions alternately arranged with each other along a transverse direction perpendicular to both the vertical direction and the front-to-back direction; wherein
a plurality of oblique portions are formed between the corresponding extrusion portions and the depression portions, respectively, to support the second group of core wires for spacing the second group of core wires away from the printed circuit board with a distance so as to have the first group of core wires and the second group of core wires alternately, along the transverse direction, arranged with each other in an offset manner in the vertical direction around the first conductor member.

3. The plug connector assembly as recited in claim 1, wherein each of the core wires comprises a pair of center conductors, an insulative layer enclosing the pair of center conductors, and a ground wire.

4. The plug connector assembly as recited in claim 3, further comprising a first conductor member disposed at the first group of the core wires, and wherein the first row of pads comprises plural pairs of first signal pads and a respective first ground pad disposed between two adjacent pairs of first signal pads, the first conductor member being electrically connected to the first ground pads, each ground wire of the first group of core wires being electrically connected to the first conductor member.

5. The plug connector assembly as recited in claim 4, wherein the first conductor member defines a number of notches for receiving the corresponding ground wires of the second group of core wires.

6. The plug connector assembly as recited in claim 4, further comprising a second conductor member disposed at the corresponding second group of the core wires, and wherein the second row of pads comprises plural pairs of second signal pads and a respective second ground pad disposed between two adjacent pairs of second signal pads, the second conductor member being electrically connected to the second ground pads, each ground wire of the second group of core wires being electrically connected to the second conductor member.

7. The plug connector assembly as recited in claim 6, wherein the second ground pads and the second signal pads are offset from corresponding first ground pads and the first signal pads in a transverse direction.

8. The plug connector assembly as recited in claim 1, wherein the second row of pads are located in front of the first row of pads in a front-to-back direction, and the insulative member covers the first row of pads and the corresponding first group of core wires in a vertical direction perpendicular to the front-to-back direction.

9. The plug connector assembly as recited in claim 8, further including a first conductor member soldered upon the first row of pads and connected to ground wires of the first group of core wires, and a second conductor member soldered upon the second row of pads and connected to ground wires of the second group of core wires, wherein the insulative member is mounted upon said side of the PCB after the first group of core wires are soldered to the first row of pads while before the second group of core wires are soldered to the second row of pads.

10. The plug connector assembly as claimed in claim 9, wherein the insulative member is located between the first conductor member and the second conductor member in the front-to-back direction.

11. The plug connector assembly as claimed in claim 10, wherein said first conductor member includes a plurality of extrusion portions and depression portions alternatively arranged with each other in a transverse direction perpendicular to both the front-to-back direction and the vertical direction, and a plurality of oblique portions are located between the neighboring extrusion portions and depression portions to respectively support the corresponding ones of the second group of core wires so as to have the core wires of the second group of core wires farther from the printed circuit board while the core wires of the first group of core wires closer to the printed circuit board in the vertical direction in an offset manner around the first conductor member.

12. The plug connector assembly as claimed in claim 10, wherein the insulative member is mounted to the side of the PCB after the first conductor member is soldered to the first row of pads while before the second conductor member is soldered to the second row of pads.

13. A method of assembling a plug connector assembly, comprising the steps of:

providing a printed circuit board (PCB), the PCB comprising a first row of pads disposed on one side thereof and a second row of pads disposed in front of the first row of pads;

providing at least one cable, the at least one cable comprising a number of core wires exposed at one end thereof and being divided into a first group of core wires and a second group of core wires, the first group of core wires soldered to the first row of pads; and providing an insulative member, the insulative member disposed at an area where the first group of core wires is soldered to the first row of pads after the first group of core wires is soldered to corresponding first row of pads, the second group of core wires being soldered to corresponding second row of pads by crossing the insulative member;

providing a first conductor member and a second conductor member, the first row of pads comprising plural pairs of first signal pads and a respective first ground member disposed between the first signal pads, the second row of pads comprising plural pairs of second signal pads and a respective second ground member disposed between the second signal pads, the first conductor member soldered to the first ground member, and the second conductor member soldered to the second ground member.

14. The electrical connector assembly as claimed in claim 2, further including an insulative member located upon the first surface of the printed circuit board to shield the first row of pads and the first group of core wires in the vertical direction, wherein said insulative member is intimately located in front of the first conductor member.

15. The electrical connector assembly as claimed in claim 14, further including an insulative over-molding piece covers both the insulative member and the conductor member.

16. The electrical connector assembly as claimed in claim 2, wherein for each of the second group of core wires one half portion is exposed outside of a space formed by the corresponding depression portion.

17. The electrical connector assembly as claimed in claim 14, wherein said insulative member is mounted upon the first surface of the printed circuit board after the first group of core wires are soldered to the first row of pads while before the second group of core wires are soldered to the second row of pads.

18. The electrical connector as claimed in claim 17, wherein the insulative member includes a plurality of covering portions and a plurality of recession portions alternately arranged with each other along the transverse direction, and the covering portions are aligned with the corresponding extrusion portions and the recession portions are aligned with the corresponding depression portions in the front-to-back direction, respectively.

* * * * *